United States Patent
Kuo et al.

(10) Patent No.: US 11,699,619 B2
(45) Date of Patent: *Jul. 11, 2023

(54) AUTOMATED TRANSFER AND DRYING TOOL FOR PROCESS CHAMBER

(71) Applicant: Taiwan Semiconductor Manufacturing Co., Ltd., Hsin-Chu (TW)

(72) Inventors: Tsung-Sheng Kuo, New Taipei (TW); Hsu-Shui Liu, Pingjhen (TW); Jiun-Rong Pai, Jhubei (TW); Shou-Wen Kuo, Hsinchu (TW); Yang-Ann Chu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 93 days.

This patent is subject to a terminal disclaimer.

(21) Appl. No.: 17/236,276

(22) Filed: Apr. 21, 2021

(65) Prior Publication Data

US 2021/0242085 A1    Aug. 5, 2021

Related U.S. Application Data

(60) Continuation of application No. 16/848,931, filed on Apr. 15, 2020, now Pat. No. 10,991,625, which is a
(Continued)

(51) Int. Cl.
*H01L 21/78* (2006.01)
*B28D 5/00* (2006.01)
(Continued)

(52) U.S. Cl.
CPC .......... *H01L 21/78* (2013.01); *B28D 5/0017* (2013.01); *B28D 7/04* (2013.01);
(Continued)

(58) Field of Classification Search
CPC .............. H01L 21/6728; H01L 21/6717
See application file for complete search history.

(56) References Cited

U.S. PATENT DOCUMENTS

| 5,236,473 A | 8/1993 | Kraus et al. |
| 2005/0264802 A1 | 12/2005 | Shibata et al. |
| 2006/0256316 A1 | 11/2006 | Tanno et al. |

FOREIGN PATENT DOCUMENTS

| CN | 201868391 U | 6/2011 |
| JP | 2003170124 A | 6/2003 |

(Continued)

OTHER PUBLICATIONS

Notice of Allowance dated Jan. 15, 2020 for U.S. Appl. No. 15/903,815.
(Continued)

*Primary Examiner* — Mounir S Amer
(74) *Attorney, Agent, or Firm* — Eschweiler & Potashnik, LLC

(57) ABSTRACT

Some embodiments relate to a processing tool for processing a singulated semiconductor die. The tool includes an evaluation unit, a drying unit, and a die wipe station. The evaluation unit is configured to subject the singulated semiconductor die to a liquid to detect flaws in the singulated semiconductor die. The drying unit is configured to dry the liquid from a frontside of the singulated semiconductor die. The die wipe station includes an absorptive drying structure configured to absorb the liquid from a backside of the singulated semiconductor die after the drying unit has dried the liquid from the frontside of the singulated semiconductor die.

20 Claims, 5 Drawing Sheets

Related U.S. Application Data division of application No. 15/903,815, filed on Feb. 23, 2018, now Pat. No. 10,665,507.

(60) Provisional application No. 62/565,192, filed on Sep. 29, 2017.

(51) Int. Cl.
*B28D 7/04* (2006.01)
*H01L 21/67* (2006.01)
*H01L 21/66* (2006.01)
*H01L 21/02* (2006.01)

(52) U.S. Cl.
CPC .. *H01L 21/02076* (2013.01); *H01L 21/67034* (2013.01); *H01L 21/67092* (2013.01); *H01L 21/67173* (2013.01); *H01L 21/67288* (2013.01); *H01L 22/12* (2013.01)

(56) References Cited

FOREIGN PATENT DOCUMENTS

| JP | 2011227018 A | 11/2011 |
|---|---|---|
| KR | 20130097450 A | 9/2013 |

OTHER PUBLICATIONS

Notice of Allowance dated Dec. 30, 2020 for U.S. Appl. No. 16/848,931.

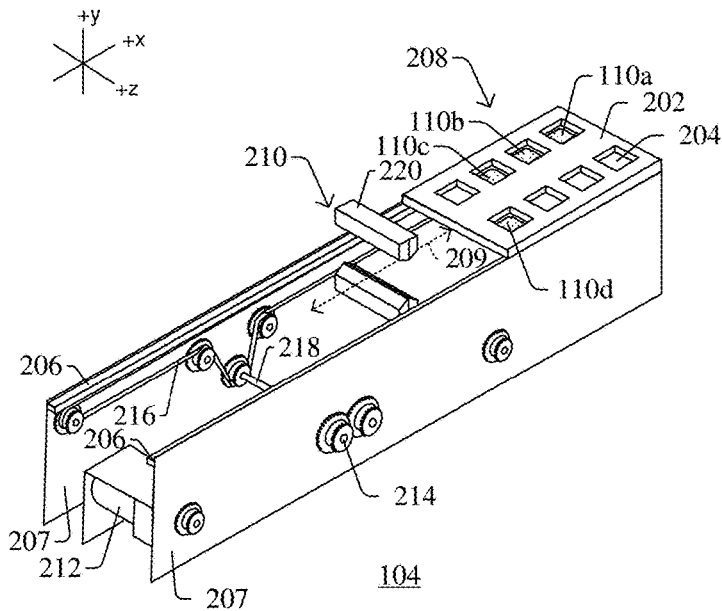
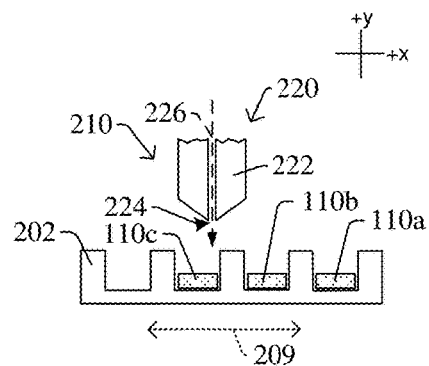
Fig. 2A
Fig. 2B
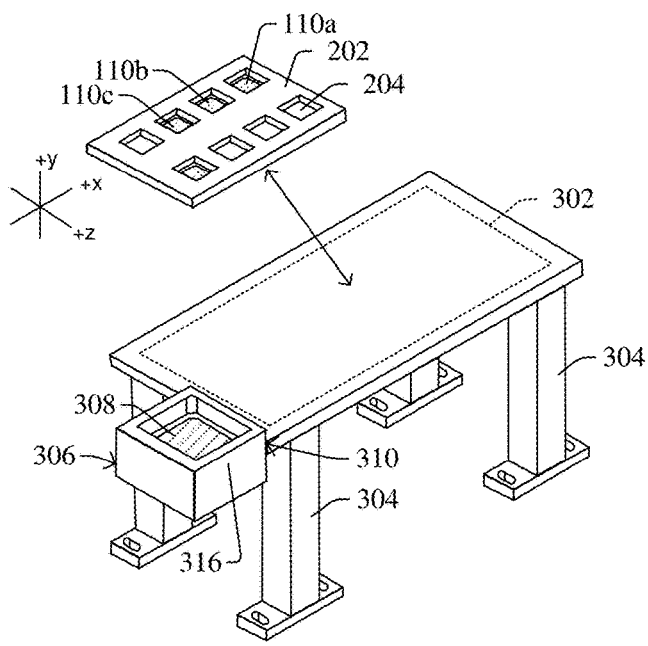
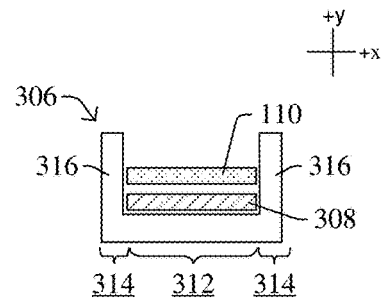
Fig. 3A
Fig. 3B

AUTOMATED TRANSFER AND DRYING TOOL FOR PROCESS CHAMBER

REFERENCE TO RELATED APPLICATIONS

This application is a Continuation of U.S. application Ser. No. 16/848,931, filed on Apr. 15, 2020, which is a Divisional of U.S. application Ser. No. 15/903,815, filed on Feb. 23, 2018 (now U.S. Pat. No. 10,665,507, issued on May 26, 2020), which claims the benefit of U.S. Provisional Application No. 62/565,192, filed on Sep. 29, 2017. The contents the above-referenced patent applications are hereby incorporated by reference in their entirety.

BACKGROUND

Integrated chips are fabricated by operating upon a semiconductor wafer (e.g., a silicon wafer) using a plurality of processing steps (e.g., etching steps, lithography steps, deposition steps, etc.). The processing steps form a plurality of features within the semiconductor wafer and/or stacked layers over the semiconductor wafer. These features and/or stacked layers are structured to implement semiconductor devices, such as transistors and interconnect layers coupling the transistors to one another, in accordance with an integrated circuit design. The integrated chips can realize predetermined functionality used in smart phones, automotive circuits, consumer electronics, and/or industrials controls, among others.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a perspective view of a drying unit in accordance with some embodiments.

FIG. 2B illustrates a partial cross-sectional view of a drying unit in accordance with some embodiments.

FIG. 3A illustrates a perspective view of a die wipe station, which includes a plate and a die tray storage station, in accordance with some embodiments.

FIG. 3B illustrates a partial cross-sectional view of the plate of the die wipe station of FIG. 3A in accordance with some embodiments.

DETAILED DESCRIPTION

Figure 1:
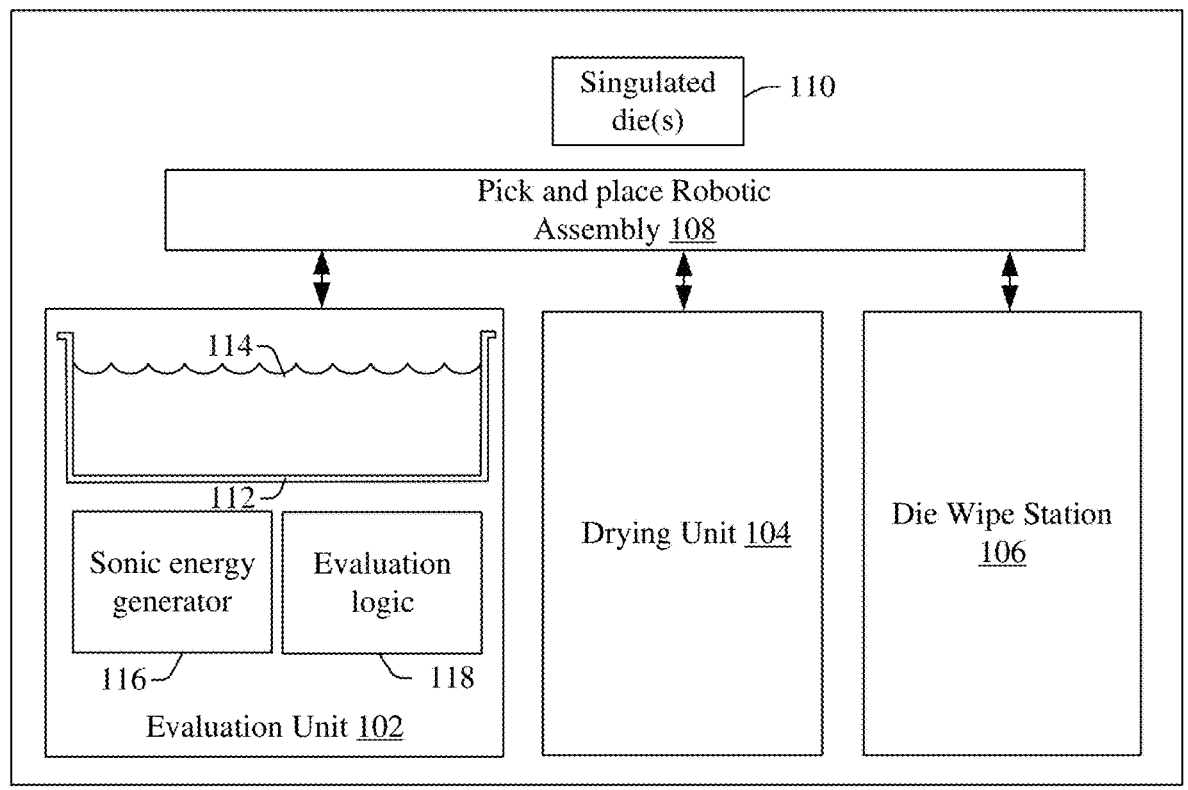
FIG. 1 illustrates some embodiments of a processing tool comprising a drying unit and die wipe station.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When the fabrication processes used to form integrated chips on a semiconductor wafer have been completed, the semiconductor wafer is diced to separate the semiconductor wafer into a plurality of separate integrated chip (IC) die. For example, a single semiconductor wafer may be diced into tens, hundreds, or even thousands of separate IC die, each of which typically has a square or rectangular shape. After dicing, the IC die are often transported to subsequent process tools using die trays. Die trays are plastic trays with a plurality of depressions that are respectively configured to hold the separate IC die. The depressions have a size corresponding to a size of the IC die and are separated by sidewalls that prevent the IC die from moving between adjacent depressions.

After the dicing process, the IC die can evaluated for defects using scanning acoustic microscopy or other techniques. Until now, after a die has been evaluated, a human operator has manually dried the die, which has led to a host of issues. For example, this manual drying takes considerable time, and exposes the die to the possibility of breakage or contamination. Also, there is no precise standard drying process that is shared across all human operators, which potentially leaves some die less dry than others.

The present disclosure relates to an integrated chip processing tool comprising an automated wafer transfer and drying tool, and associated method. By operating the automated wafer transfer and drying tool to dry the die, processing time can be reduced and damage and/or contamination risks related to a manual transfer of IC die can be mitigated.

FIG. 1 illustrates some embodiments of a block diagram for an integrated chip processing tool 100 for processing one or more singulated semiconductor die 110. The integrated chip processing tool 100 includes an evaluation unit 102, a drying unit 104, and a die wipe station 106. A pick and place robotic assembly 108 transfers singulated semiconductor die 110 into and out of the processing tool 100 and to and from the evaluation unit 102, the drying unit 104, and the die wipe station 106.

The evaluation unit 102 is configured to subject the singulated semiconductor die 110 to a liquid 114 to detect flaws, if any, in the singulated semiconductor die 110. In some cases, scanning acoustic microscopy (SAM), which is a non-destructive technique, is used to evaluate the singulated semiconductor die and detect flaws. During SAM, the singulated semiconductor die 110 may be completely immersed in liquid 114 or scanned with a narrow stream of liquid. The liquid 114 is typically water, but alcohols and other fluids can be used so as to limit contamination of the sample. In some embodiments, the evaluation unit 102 includes a tank 112 configured to house the liquid 114 such that the singulated semiconductor die 110 can be received in the tank 112 and immersed in the liquid 114. A sonic or ultrasonic energy generator 116, such as a transducer, is arranged on a sidewall or bottom surface of the tank 112, and is configured to generate a pressure wave though the liquid 114 to impact the singulated semiconductor die 110. While the singulated semiconductor die 110 is immersed in (or otherwise in contact with) the fluid 114, the transducer raster-scans the top surface of the singulated semiconductor die 110. During this scanning, several thousand ultrasonic pulses enter the singulated semiconductor die 110 each second. Each ultrasonic pulse may be scattered or absorbed as it passes through homogeneous parts of the one or more singulated semiconductor die. At material interfaces where there is a discontinuity at which two different materials adjoin one another, a portion of the pulse is reflected back to the transducer. Accordingly, the evaluation logic 118 includes a receiver that is configured to receive this reflected pulse, which contains information about the interaction of the generated pressure wave with the singulated semiconductor die 110. The receiver in the evaluation logic 118 receives the reflected pulse and records its amplitude. The reflected portion of the pulse can be evaluated and can ultimately be used to detect flaws in internal features of the one or more singulated semiconductor die 110, such as discontinuities in silicon, cracks, de-laminations, and voids.

After the singulated semiconductor die 110 has been evaluated, residual amounts of the liquid 114 are present on a frontside and a backside of the singulated semiconductor die 110. Thus, the pick and place robotic assembly 108 is configured to pick-up the singulated semiconductor die 110 after the singulated semiconductor die 110 has been processed by the evaluation unit 102, and is configured to transfer the singulated semiconductor die 110 to the drying unit 104. The drying unit 104 is configured to dry the liquid from a frontside of the singulated semiconductor die 110, in some cases by using a wind knife. Residual liquid may still be present on the backside of the singulated semiconductor die 110, even after frontside drying.

After the singulated semiconductor die 110 has been processed by the drying unit 104, the pick and place robotic assembly 108 picks-up the singulated semiconductor die 110 and transfers the singulated semiconductor die 110 to the die wipe station 106. The die wipe station 106 is configured to absorb the liquid from a backside of the singulated semiconductor die 110 after the drying unit 104 has dried the liquid 114 from the frontside of the singulated semiconductor die 110.

Referring briefly to FIG. 2A, one can see an example of a drying unit 104 in accordance with some embodiments. The drying unit 104 includes a die tray 202, which has a plurality of depressions 204 each suited to retain an individual singulated semiconductor die 110. Often, the depressions 204 are arranged in a series of N rows×M columns (e.g., 2 rows×4 columns in FIG. 2, though N and M can each be any number and M and N can be equal or different). For purposes of illustration, singulated semiconductor dies (110a-110d) are only shown in some of the depressions 204, but in other embodiments all depressions will contain a corresponding die.

A transfer track in the form of a ledge 206 extending outward from sidewalls 207 of the drying unit is configured to slideably transfer the die tray 202 from a loading position 208 on the transfer track to a drying position 210 on the transfer track (see translation arrow 209). A motor 212 is operably coupled to gears (e.g., 214), and a belt 216 that wraps around hubs of the gears and is driven by the motor 212. Thus, when the motor 212 rotates, the motor 212 in turn rotates the gears 214 via a driveshaft 218, and the gears 214 move the belt 216 which is attached to the die tray 202. In this way, the die tray 202 can be moved from the loading position 208 to the drying position 210. Mechanisms other than a motor and belt can also be used—for example, in other embodiments, actuators, hydraulic pressure, magnetic fields, or electric fields can be used.

The drying unit 104 of FIG. 2A also includes wind knife 220 disposed over the transfer track 206 at the drying position 210. The wind knife 220 is configured to blow liquid off upper surfaces of the singulated semiconductor die when the singulated semiconductor die are retained within the die tray 202 as the die tray 202 is slideably transferring the singulated semiconductor die from the loading position 208 to the drying position 210. As shown in FIG. 2B, the wind knife 220 includes a rigid body 222 including a narrow slot 224 through which gas 226, such as air or pure nitrogen, is blown at a high velocity. The high-velocity gas 226 is directed toward onto the upper surface of the singulated semiconductor die 110 to forcibly blow any remaining liquid from the upper surfaces of the singulated semiconductor die 110. In some embodiments, the high-velocity gas 226 is directed at an angle of 90-degrees relative to the top surface of the die 110, while in other embodiments, the high-velocity gas 226 strikes the top surface of the die at an angle of less than 90-degrees.

Referring briefly to FIG. 3A, one can see an example of a die wipe station 106 in accordance with some embodiments. The die wipe station 106 includes a support structure having a substantially planar surface 302 configured to receive a die tray 202 and a plurality of legs 304 supporting the substantially planar surface 302. A plate or dish structure 306, which retains an absorptive drying structure 308, has an outer edge that meets an outer edge of the substantially planar surface at an interface 310.

As illustrated in FIG. 3B, the plate or dish structure 306 has a central region 312 and a peripheral region 314, wherein outer sidewalls 316 extend upwardly from the peripheral region such that an upper surface of the central region 312 is recessed relative to upper regions of the outer sidewalls 316. A cloth or sponge that corresponds to the absorptive drying structure 308 is arranged on the central region 312 and is laterally confined by the outer sidewalls 316. The pick and place robotic assembly 108 picks up a die 110 from the die tray 202 and places the die 110 on an upper surface of the absorptive drying structure 308 (see FIG. 3B), such that the backside of the die 110 is dried by making direct contact with a top surface of the absorptive drying structure 308. In some cases, the absorptive drying structure 308 rests in a stationary manner while the die 110 is set thereon, while in other embodiments, the absorptive drying structure 308 can rotate or spin about a central point on its face, or can turn in a belt-like manner about rollers or gears to facilitate drying.

Thus, because this integrated chip processing tool 100 of FIG. 1, along with the units illustrated in FIGS. 2A-2B and 3A-3B, limits human contact with the die and achieve reliable drying of the die, this processing tool 100 reduces processing time, damage and/or contamination risks for dies, compared to previous approaches.

Figure 4:
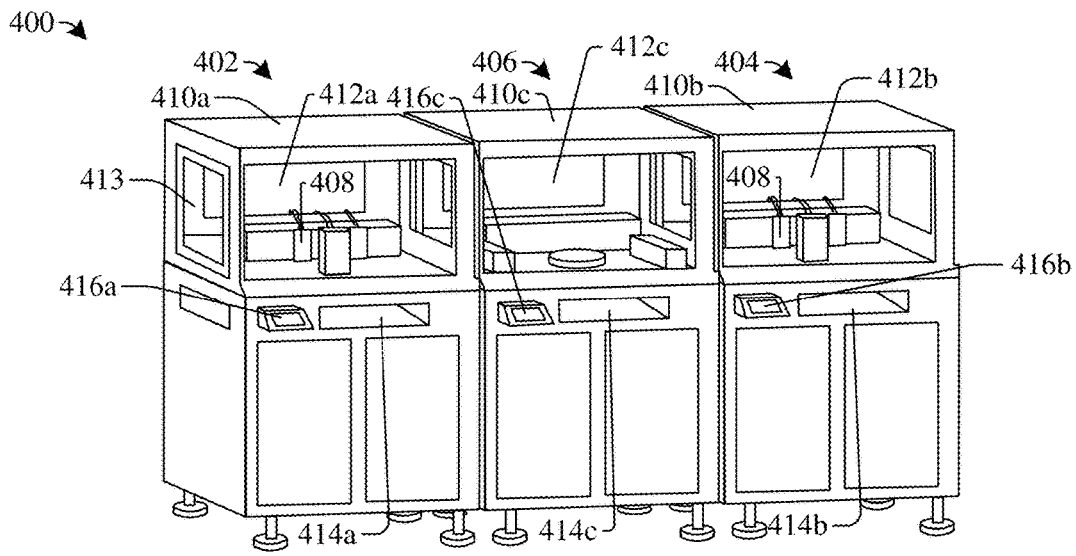
FIG. 4 illustrates some embodiment of a perspective view of an integrated chip processing tool comprising an automated transfer and drying tool.

FIG. 4 illustrates a perspective view of some additional embodiments of an integrated chip processing tool 400 comprising a first processing tool 402, a second processing tool 404, and an automated transfer and drying tool 406 disposed between the first and second processing tools 402, 404. In some embodiments, the first and second processing tools 402, 404 can be identical units, each of which includes one or more scanning acoustic microscopes 408 which are configured to detect defects on singulated semiconductor die loaded into the integrated chip processing tool 400. In some embodiments, the first and second processing tools 402, 404 include first and second housings 410a, 410b and the automated transfer and drying tool 406 includes a third housing 410c. The housings 410a, 410b, 410c are typically made of sheet metal and surround first, second, and third interior chambers 412a, 412b, 412c of the respective tools. Windows 413, which are made of glass, acrylic, or clear plastic for example, are disposed in the housing of each tool and allow viewing into respective interior chambers of the tools. Each tool can also include a loading/unloading port 414a, 414b, and 414c through which one or more die trays can be loaded into the tools, and a control panel 416a, 416b, and 416c which allows a human operator to provide commands to the tool and/or receive status updates from the respective tools.

Within each tool's interior chamber 412a, 412b, 412c, robotic processing units receive a die tray through a loading/unloading port, and then lift one or more singulated semiconductor die from the die tray and process the one or more singulated semiconductor die. For example, the one or more singulated semiconductor die can be loaded into the first and/or second processing tools 402, 404, and a scanning acoustic microscope 408 can be used to evaluate the one or more singulated semiconductor die for defects or flaws. During scanning acoustic microscopy, the one or more singulated semiconductor die may be completely immersed in water or other fluids, or scanned with a narrow stream of water or fluids to evaluate the die for flaws. After the one or more singulated semiconductor die have been evaluated, the one or more singulated semiconductor die are processed by the automated drying tool 406. The automated drying tool 406 includes robotic units that carry out various actions to dry the one or more singulated semiconductor die without needing intervention by a human operator. By operating the automated transfer and drying tool 406 to automatically dry the one or more singulated semiconductor die, processing time can be reduced and damage and/or contamination risks related to a manual transfer of IC die can be mitigated. After the one or more singulated semiconductor die have been dried, the one or more die can be automatically loaded back into the die tray, and passed back out through the loading/unloading port 414c. The die tray can then be moved, for example by a human operator or by a conveyor belt or other automated assembly, onto the next desired fabrication, testing, and/or packaging stage.

FIG. 5A shows a block diagram of the processing tool 400 and the first processing tool 402, the second processing tool 404, and the automated transfer and drying tool 406. The first and second processing tools 402, 404 each include an interior chamber 412a, 412b that houses a scanning acoustic microscope 408 and a de-bubble function 420. The automated transfer and drying tool 406 includes an interior chamber 412c, which houses a multi-axis robot 422, first and second loading/unloading stations 424a, 424b, first and second die tray storage stations 426a, 426b, a conveyor 428, a dry wipe station 430, first and second drying stations 432a, 432b, and a pick-and-place robotic assembly 434.

Figure 6:
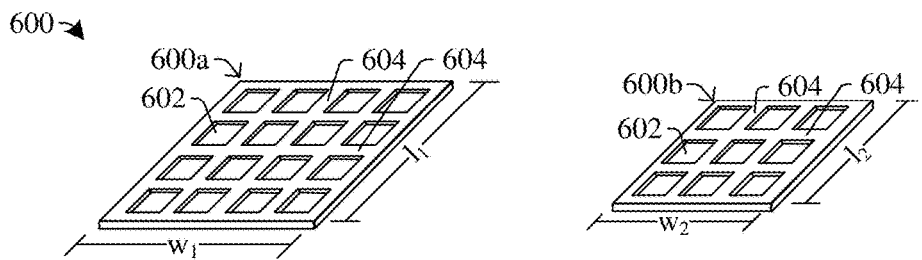
FIG. 6 illustrates some embodiments of die trays.

In some embodiments, operation of the processing tool assembly is as follows. First, a first die tray which is filled with singulated semiconductor die is placed on the loading/unloading station 424a though port 414c, and a second die tray which is empty is placed on the second loading/unloading station 424b through port 414c. Referring briefly to FIG. 6, one can see an example of die trays 600. The die trays 600 can be made of plastic, acrylic, metal or another suitable material, and are each in the form of a tray having a plurality of depressions 602 that are respectively configured to hold the separate singulated semiconductor die. The depressions 602 have a size corresponding to a size of the singulated semiconductor die and are separated by sidewalls 604, which run in parallel to one another along the length and width of the die trays. The sidewalls 604 confine the singulated semiconductor die within their respective depressions, and prevent the singulated semiconductor die from moving between adjacent depressions. In some cases the first die tray 600a is a die tray that is used to transfer singulated semiconductor die through the fabrication facility, and the second die tray 600b is a die tray specifically sized to be processed by the first and/or second processing tool. For example, the first die tray 600a and second die tray 600b can be made of different material, can have different sizes, and/or can hold different numbers of die from one another in some cases. For instance, the first die try 600a can often be larger than the second die tray, can be rectangular, and can have a first exterior perimeter that measures from 2 inches to 30 inches on its short side (first width, $w_1$) and from 3 inches to 36 inches on its long side (first length, $l_1$); while the second die tray 600b can also be rectangular and can have a second exterior perimeter that measures from 2 inches to 28 inches on its short side (second width, $w_2$) and 3 inches to 30 inches on its long side (second length, $l_2$). Further, in some cases, the first die tray 600a can initially be loaded on the first loading/unloading station 424a when filled with singulated semiconductor die, while the second die tray 600b can be initially loaded on the second loading/unloading station 424b when empty.

Referring back to FIG. 5A, after the first and second die trays have been loaded into the loading/unloading stations 424a, 424b, a first push bar 425a pushes the first die tray from the first loading/unloading station 424a to the first die tray storage station 426a, and a second push bar 425b pushes the second die tray from the second loading/unloading station 424b to the second die tray storage station 426b. For example, in many embodiments, the first push bar 425a pushes the first die tray from the first loading/unloading station 424a onto a first conveyor belt 427a, and the first conveyor belt 427a, then the first conveyor belt 427a transfers the first die tray to the first die tray storage station 426a. The second push bar 425b similarly pushes the second die tray from the second loading/unloading station 424b onto a second conveyor belt 427b, and the second conveyor belt 427b then transfers the first die tray to the first die tray storage station 426b.

The pick and place robotic assembly 434 picks one or more die from the first die tray on 426a, which was initially filled with singulated semiconductor die, and places them into the second die tray on 426b, which was initially empty.

The multi-axis robot 422 then moves the entire second die tray from 426b, which now includes die which were previously in the first die tray, into the interior chamber 412a of the first processing tool 402. The first processing tool 402 then performs processing (e.g. scanning acoustic microscopy 408 and a de-bubble function 420) on the singulated semiconductor die, and after processing, returns the die to the second die tray within the interior chamber 412a.

The multi-axis robot 422 then moves the entire second die tray, which now includes singulated semiconductor die processed by the first processing tool 402, back to the second die tray storage station 426b. At this point, pick and place robotic assembly 434 picks individual singulated semiconductor die from the second die tray on 426b to the drying station 432b, and the drying station 432b dries the front sides of the singulated semiconductor die, for example, by passing the die through a wind knife that has a long and narrow stream of high-velocity air that blows the fluid off of the frontsides of the singulated semiconductor die. After the frontsides of the singulated semiconductor die have been dried in this manner, the pick and place robotic assembly 434 transfers the individual singulated semiconductor die back to the die tray on the second die tray storage station 426b. The pick and place robotic assembly 434 then moves the singulated semiconductor die to the die wipe station 430 where the backside of the singulated semiconductor die can be dried. For example, the backside of the singulated semiconductor die can be wiped with a dry, dust free cloth on the die wipe station 430 to dry the backside of the singulated semiconductor die.

After the backside of the singulated semiconductor die has been dried, the pick and place robotic assembly 434 can transfer the dried singulated semiconductor die back to the first die tray (which is empty at this time) on the first die tray storage station 426a. The first die tray, which now includes singulated semiconductor die that have been evaluated with scanning acoustic microscopy techniques and dried, can then be moved back to the first loading/unloading station 424a, and passed back out through the loading/unloading port 414c. The first die tray can then be moved, for example by a human operator or by a conveyor or other automated assembly, onto the next desired fabrication, testing, and/or packaging stage.

Although the die tray storage stations 426a, 426b and conveyor 428 are illustrated as transferring a single die tray, it will be appreciated that in some embodiments the die tray storage stations 426a, 426b and conveyor 428 may concurrently store and/or transfer multiple die trays, thereby enabling the integrated chip processing tool 400 to process multiple die trays at a same time. Furthermore, in various embodiments, one or more of the die tray die tray storage stations 426a, 426b and conveyor 428 may be concurrently operated to concurrently transfer die trays between the various tools, modules, and/or components in the integrated chip processing tool assembly.

Figure 5:
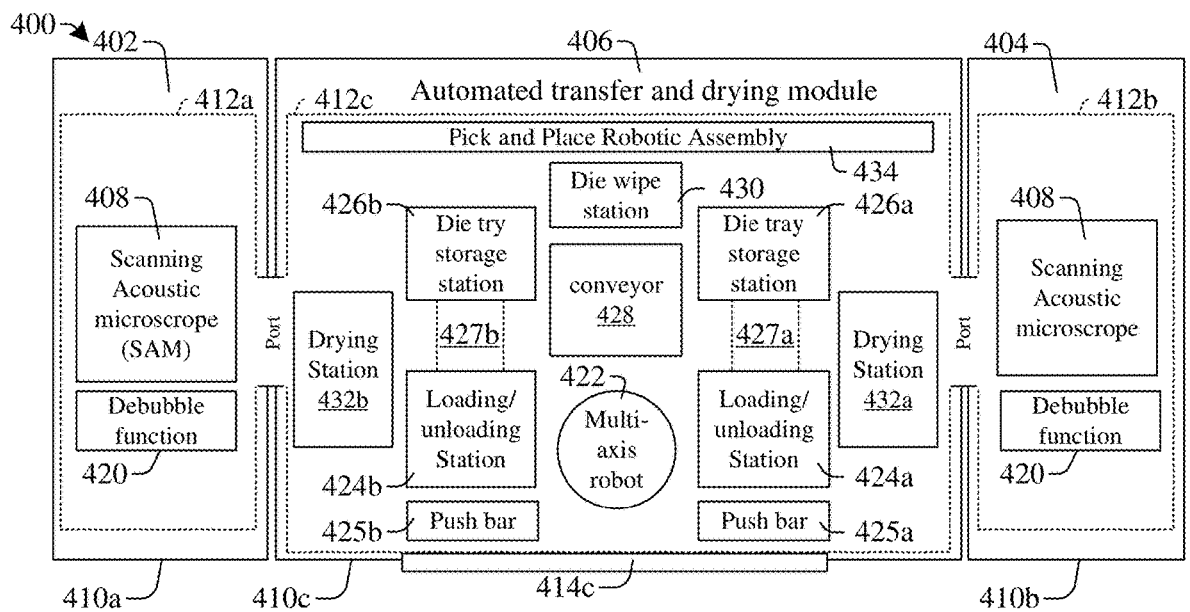
FIG. 5 illustrates some embodiments of a block diagram of a processing tool comprising first and second scanning acoustic microscope tools and an automated transfer and drying tool.

FIGS. 7 and 9-11 illustrate three-dimensional (3D) views of some embodiments of components that make up an automated transfer and drying module 406 of FIG. 5. Each of these components is now described in further detail, although it will be appreciated that these figures and description below are merely non-limiting examples of how these components can be implemented.

Figure 7:
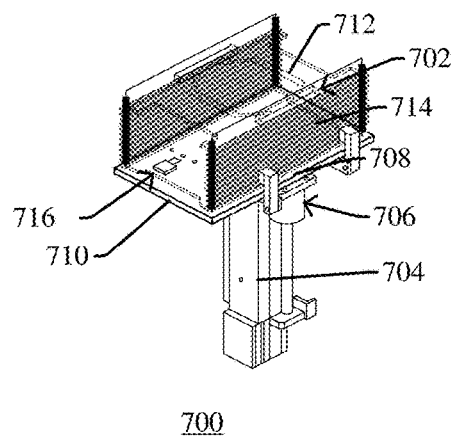
FIGS. 7-11 illustrate some embodiments of components that make up an automated transfer and drying tool, in accordance with FIG. 5.

FIG. 7 illustrates a die tray loading/unloading station 700, which corresponds to some examples of loading/unloading station 424a, 424b in FIG. 5. The die tray loading/unloading station 700 includes a die tray rack 702, and one or more legs 704 that mount the die tray rack 702 in the housing of the processing tool. The leg(s) 704 can include a plurality of concentric tubes that telescopically change in height to move the die tray rack 702 upward and/or downward. A clamp assembly 706 couples the die tray rack 702 to the one or more legs 704. Rather than the legs 704 moving telescopically to change the height of the die tray rack 702, the clamp assembly 706 can alternatively engage the one or more legs 704, for example, by a series of ridges and/or gears to move upward and downward. The clamp assembly 706 includes a pair of finger-like projections 708 on each side of the die tray rack 702 that frictionally engage the die tray rack 702. The die tray rack 702 takes the form of a box-like enclosure having a bottom surface 710, top surface 712, sidewall surfaces 714, and ends 716. The ends 716 are open, such that one or more die trays 600 (see e.g., FIG. 6) can be slideably stacked into the die tray rack 702.

Figure 8:
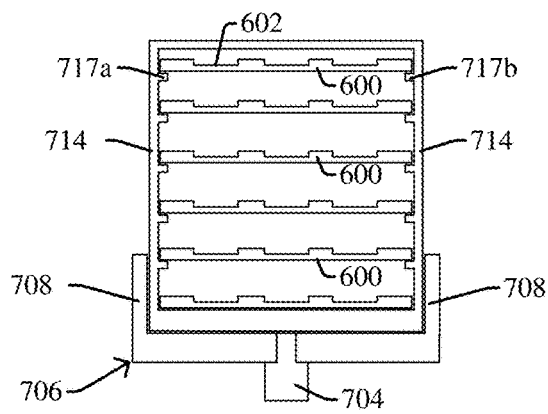

As seen in FIG. 8, which illustrates a cross-sectional view of the die tray loading/unloading station 700, the sidewalls 714 include a series of ridges or projections 717 which are adapted to retain a number of die trays 600 thereon. Thus a first ridge 717a on one of the sidewalls is aligned vertically to a second ridge 717b on the opposite sidewall, such that the first and second ridges 717a, 717b form a shelf of sorts to hold a die tray 600. The die trays 600 can rest upon the ridges, such that the die trays can be pushed or slid into and out of the ends 716 of the die tray rack 702, for example, by a push bar (e.g., 425a or 425b in FIG. 5), and/or by a multi-axis robot (e.g., 422 in FIG. 5). The die trays 600 are loaded so their depressions 602 are facing up to retain their respective singulated semiconductor die therein.

Figure 9:
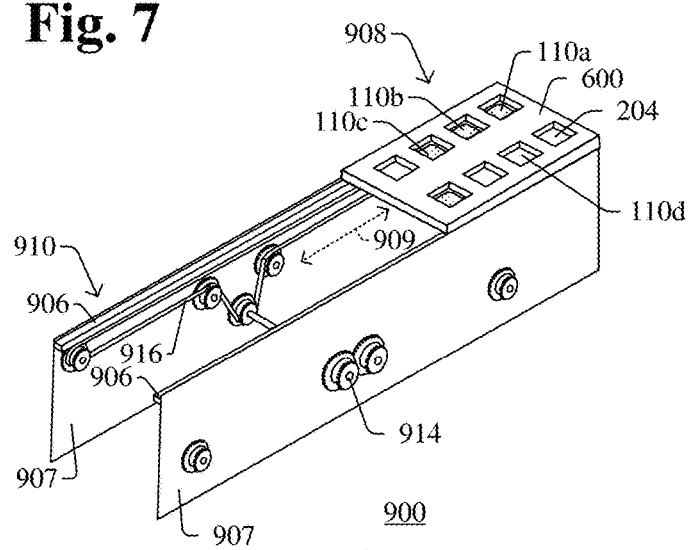

FIG. 9 illustrates a conveyor 900, such as conveyor 428 in FIG. 5 and/or first and/or second conveyor belt 427a, 427b in FIG. 5. The conveyor 900 includes a transfer track in the form of ledges 906 extending outward from sidewalls 907 of the conveyor. The ledge 906 is configured to slideably transfer a die tray 600 from a first conveyor end 908 to a second conveyor end 910 opposite the first conveyor end (see translation arrow 909). A motor is operably coupled to gears (e.g., 914), and a belt 916 that wraps around hubs of the gears and is driven by the motor. In some embodiments, the motor is shared between the conveyor and other components, such as a drying unit (see 104 in FIG. 2A), to reduce costs. For this reason, FIG. 9 does not explicitly illustrate a motor, though it will be appreciated that a motor or other drive mechanism is used to move the die tray 600 on the conveyor 900. Mechanisms other than a motor and belt can also be used—for example, in other embodiments, actuators, hydraulic pressure, magnetic fields, or electric fields can be used.

Figure 10:
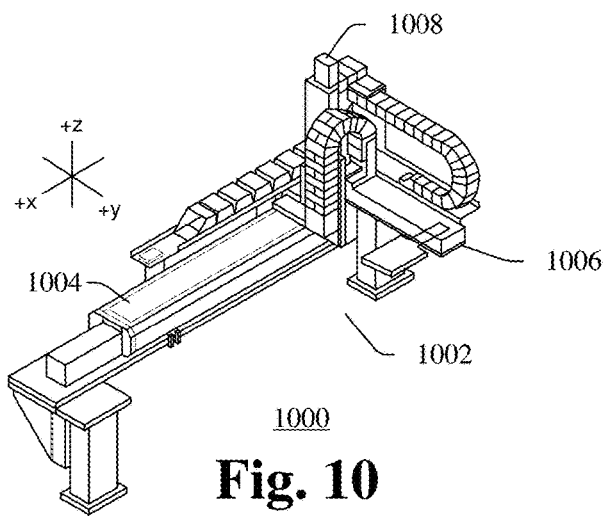
Figure 11:
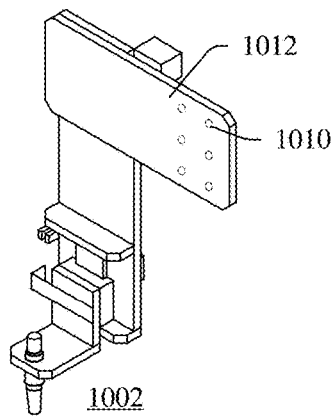

FIG. 10 illustrates a pick and place robotic assembly 1000, such as pick and place robotic assembly 108 in FIG. 1 and/or pick and place robotic assembly 434 in FIG. 5. The pick and place robotic assembly 1000 is configured to pick up one or more singulated semiconductor die from a die tray and/or other component using a vacuum head 1002, and then move the singulated semiconductor die along three orthogonal axes (e.g., x-axis, y-axis and z-axis) to a desired drop off location. Thus, the pick and place robotic assembly 1000 includes a first robotic arm 1004 extending in a first direction (e.g., along the x-axis), a second robotic arm 1006 extending in a second direction (e.g., along the y-axis), and a third robotic arm 1008 extending in a third direction (e.g., z-axis).

Thus, the vacuum head 1002 can be positioned over one or more die of interest, for example, in a die tray, by moving the first robotic arm 1004, second robotic arm 1006, and third robotic arm 1008 with regards to one another. For example, the third robotic arm 1008 can slide along the first robotic arm 1004 to move the vacuum head 1002 in the x-direction, then the vacuum head 1002 can slide along the second robotic arm 1006 to move the vacuum head in the y-direction, thereby placing the vacuum head directly over the die of interest. The vacuum head can then be lowered by sliding the second robotic arm 1006 along the third robotic arm 1008, such that a face of the vacuum head 1002 comes close to or into direct contact with the die of interest. At that point, vacuum is applied such that openings (see 1010 in FIG. 11) in the face 1012 of the vacuum head 1002 experience suction (e.g., low pressure) that causes the die of interest to "stick" to the face 1012 of the vacuum head 1002. In some embodiments, the vacuum head 1002 has a sufficient number of openings 1010 to pick and place multiple die at the same time, but in other embodiments the vacuum head 1002 has a single opening 1010 to pick and place only a single die.

Thus, the pick and place robotic assembly 1000 can transfer dies to and from various components in the IC processing tool, thereby helping to evaluate the die for defects and to dry the frontside and backside of the die with limited exposure to contaminants and limited risk of breakage.

Therefore, some embodiments relate to a processing tool for processing a singulated semiconductor die. The tool includes an evaluation unit, a drying unit, and a die wipe station. The evaluation unit is configured to subject the singulated semiconductor die to a liquid to detect flaws in the singulated semiconductor die. The drying unit is configured to dry the liquid from a frontside of the singulated semiconductor die. The die wipe station includes an absorptive drying structure configured to absorb the liquid from a backside of the singulated semiconductor die after the drying unit has dried the liquid from the frontside of the singulated semiconductor die.

Figure 12:
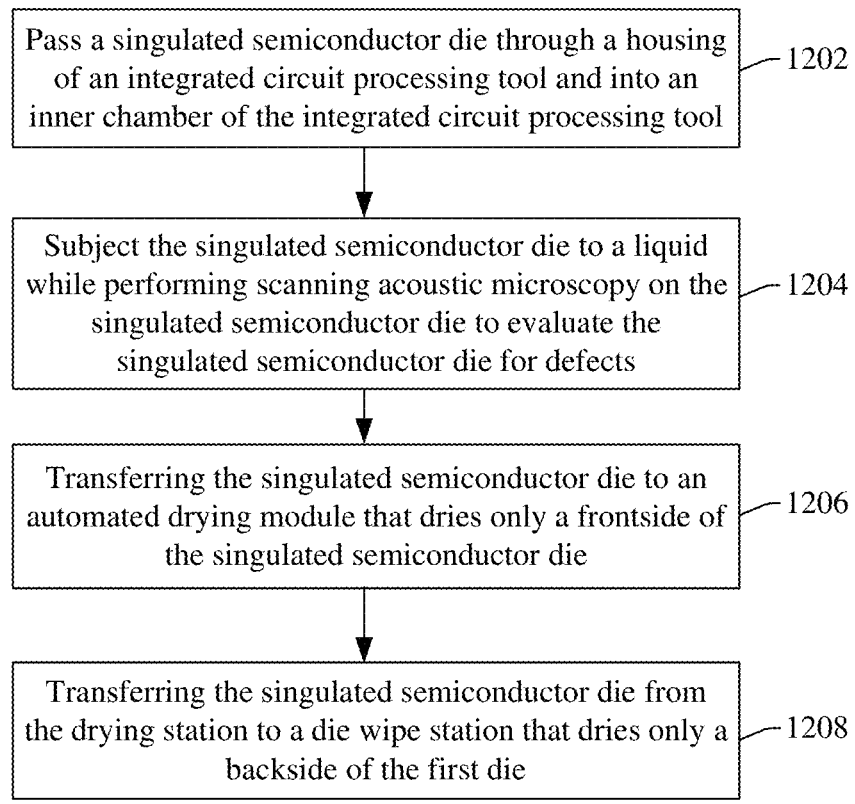
FIG. 12 shows a method of processing a singulated semiconductor die for flaws in accordance with some embodiments.

FIG. 12 illustrates a method 1200 of processing a singulated semiconductor die for flaws in accordance with some embodiments.

The method begins at 1202, when a singulated semiconductor die is passed through a housing of an automated transfer and drying tool into an inner chamber of the automated transfer and drying tool.

At 1204, the singulated semiconductor die is subjected to a liquid while performing scanning acoustic microscopy on the singulated semiconductor die. In this way, the singulated semiconductor die is evaluated for defects.

At 1206, the singulated semiconductor die is transferred to an automated drying module that dries only a frontside of the singulated semiconductor die. For example, the automated drying module can achieve frontside drying by using a wind knife in some embodiments.

At 1208, the singulated semiconductor die is transferred from the automated drying module to a die wipe station that dries only a backside of the first die. For example, the die wipe station can achieve backside drying of the die by using an absorptive drying structure, such as a dust-free cloth or a sponge, in some embodiments.

Some embodiments relate to processing tool for processing a singulated semiconductor die. The processing tool includes an evaluation unit configured to subject the singulated semiconductor die to a liquid to detect flaws in the singulated semiconductor die. After the singulated semiconductor die has been evaluated, the liquid is present on a frontside and a backside of the semiconductor die. A drying unit is configured to dry the liquid from a frontside of the singulated semiconductor die. A die wipe station, which includes an absorptive drying structure, is configured to absorb the liquid from a backside of the singulated semiconductor die after the drying unit has dried the liquid from the frontside of the singulated semiconductor die.

Some other embodiments relate to an integrated chip processing tool for processing a singulated semiconductor die. The processing tool includes a first housing that surrounds a first chamber. An evaluation unit is disposed within the first chamber and is configured to subject the singulated semiconductor die to a liquid to detect flaws in the singulated semiconductor die. An automated transfer and drying tool includes a second housing that surrounds a second chamber. A loading/unloading station is configured to receive a die tray through the second housing, wherein the die tray retains a plurality of singulated semiconductor die that include the singulated semiconductor die. A port extends through the first housing and the second housing, and selectively connects the first chamber to the second chamber. A multi-axis robot is configured to pick-up a subset of the plurality of singulated semiconductor die, and transfer the subset of the plurality of singulated semiconductor die from the second chamber to the first chamber through the port for processing of the subset of the plurality of singulated semiconductor die by the evaluation unit. The multi-axis robot is further configured to, after the subset of the plurality of die have been processed by the evaluation unit, transfer the subset of the plurality of singulated semiconductor die to a drying unit that dries a frontside of the singulated semiconductor die.

Still other embodiments relate to a method of processing a plurality of IC die. In this method, a singulated semiconductor die is passed through a housing of an automated transfer and drying tool into an inner chamber of the automated transfer and drying tool. The singulated semiconductor die is subjected to a liquid while performing scanning acoustic microscopy on the singulated semiconductor die to evaluate the singulated semiconductor die for defects. The liquid remains present on an upper surface and a lower surface of the singulated semiconductor die after evaluation. The singulated semiconductor die is transferred to an automated drying module that dries only a frontside of the singulated semiconductor die. The singulated semiconductor die is transferred from the automated drying module to a die wipe station that dries only a backside of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A processing tool for processing a singulated semiconductor die, comprising:
   an evaluation unit configured to subject the singulated semiconductor die to a liquid;
   a drying unit configured to dry the liquid from a frontside of the singulated semiconductor die; and
   a die wipe station downstream of the drying unit and comprising an absorptive drying structure configured to absorb liquid from a backside of the singulated semiconductor die.

2. The processing tool of claim 1, wherein the die wipe station comprises:

a plate having a central plate region and a peripheral plate region, wherein outer sidewalls extend upwardly from the peripheral plate region such that an upper surface of the central plate region is recessed relative to upper regions of the outer sidewalls; and a cloth or sponge corresponding to the absorptive drying structure and arranged on the central plate region and laterally confined by the outer sidewalls.

3. The processing tool of claim 2, wherein the die wipe station comprises:

a support structure having a substantially planar surface configured to receive a die tray and a plurality of legs supporting the substantially planar surface; and wherein an outer edge of the peripheral plate region meets an outer edge of the substantially planar surface.

4. The processing tool of claim 1, wherein the evaluation unit comprises:

a tank configured to house the liquid such that the singulated semiconductor die can be received in the tank and immersed in the liquid;

a sonic or ultrasonic energy generator configured to generate a pressure wave though the liquid to impact the singulated semiconductor die; and evaluation logic configured to receive a reflected pressure wave that is based on interaction of the pressure wave with the singulated semiconductor die, and further configured to detect flaws in the singulated semiconductor die based on the reflected pressure wave.

5. The processing tool of claim 1, further comprising:

a multi-axis robot configured to pick-up the singulated semiconductor die after the singulated semiconductor die has been processed by the evaluation unit, and configured to transfer the singulated semiconductor die to the drying unit, and further configured to transfer the singulated semiconductor die from the drying unit to the die wipe station.

6. The processing tool of claim 5, wherein the multi-axis robot is configured to transfer the singulated semiconductor die to the die wipe station to dry the backside of the singulated semiconductor die via the absorptive drying structure after the liquid has been dried from the frontside of the singulated semiconductor die.

7. The processing tool of claim 1, wherein the drying unit and the die wipe station are enclosed in a first chamber, and the evaluation unit is enclosed in a second chamber that is operably coupled to the first chamber via a transfer port extending between a sidewall of the first chamber and a sidewall of the second chamber.

8. The processing tool of claim 1, wherein the drying unit comprises:

a die tray, which has a plurality of depressions each suited to retain an individual singulated semiconductor die;

a transfer track configured to slideably transfer the die tray from a loading position on the transfer track to a drying position on the transfer track; and a wind knife disposed over the transfer track and configured to blow liquid off upper surfaces of the individual singulated semiconductor die as the die tray is slidably transferring from the loading position on the transfer track to the drying position on the transfer track.

9. An integrated chip processing tool for processing a singulated semiconductor die, comprising:

a processing tool comprising:
a first housing that surrounds a first chamber;
an evaluation unit disposed within the first chamber and configured to subject the singulated semiconductor die to a liquid;

an automated transfer and drying tool comprising:
a second housing that surrounds a second chamber;
a multi-axis robot configured to pick-up the singulated semiconductor die, and transfer the singulated semiconductor die from the second chamber to the first chamber for processing of the singulated semiconductor die by the evaluation unit, and further configured to, after the singulated semiconductor die has been processed by the evaluation unit, transfer the singulated semiconductor die to a drying unit configured to dry an upper surface of the singulated semiconductor die.

10. The integrated chip processing tool of claim 9, wherein the multi-axis robot is further configured to, after the upper surface of the singulated semiconductor die has been dried, transfer the singulated semiconductor die to a die wipe station in the first chamber where a backside of the singulated semiconductor die is dried.

11. The integrated chip processing tool of claim 10, wherein the die wipe station comprises:

a support structure have a substantially planar surface on which a die tray is received and a plurality of legs supporting the substantially planar surface; and a plate-like structure on an edge of the substantially planar surface, the plate-like structure having a depression that is laterally bound by a sidewall, wherein the depression is sized to retain a single singulated semiconductor die and wherein a lower surface of the plate-like structure includes an opening in a bottom portion of the depression.

12. The integrated chip processing tool of claim 9, wherein the automated transfer and drying tool comprises:

a die tray, which has a plurality of depressions each suited to retain an individual singulated semiconductor die;

a transfer track configured to slideably transfer the die tray from a loading position on the transfer track to a drying position on the transfer track; and a wind knife disposed over the transfer track and configured to blow liquid off upper surfaces of the individual singulated semiconductor die when the die are retained within the die tray as the die tray is slidably transferring the die from the loading position on the transfer track to the drying position on the transfer track.

13. The integrated chip processing tool of claim 9, wherein the evaluation unit comprises:

a tank configured to house the liquid such that the singulated semiconductor die can be received in the tank and immersed in the liquid;

a sonic energy generator configured to generate a pressure wave though the liquid to impact the singulated semiconductor die; and evaluation logic configured to receive a reflected pressure wave that is based on interaction of the pressure wave with the singulated semiconductor die, and further configured to detect flaws in the singulated semiconductor die based on the reflected pressure wave.

14. A tool assembly, comprising:

a first integrated circuit processing tool including a first housing that surrounds a first inner chamber of the first integrated circuit processing tool;

an evaluation unit disposed within the first housing, the evaluation unit configured to subject an upper surface and a lower surface of a singulated semiconductor die to a liquid;

a second integrated circuit processing tool including a second housing that surrounds a second inner chamber of the second integrated circuit processing tool, wherein the second inner chamber retains a die wipe station configured to dry only the lower surface of the singulated semiconductor die.

15. The tool assembly of claim 14, further comprising:
a transfer assembly configured to transfer the singulated semiconductor die from the first inner chamber to the second inner chamber such that the die wipe station can dry the liquid present on lower surface of the singulated semiconductor die;
wherein the transfer assembly is configured to retain the singulated semiconductor die on a first die tray with a plurality of other singulated semiconductor die and pass the first die tray from the first inner chamber to the second inner chamber.

16. The tool assembly of claim 15, further comprising:
a loading/unloading station in the second housing, the loading/unloading station configured to retain multiple die trays stacked over one another;
a conveyor configured to transfer the first die tray from the loading/unloading station to a die tray station in the second housing; and
a pick and place robotic assembly configured to transfer the singulated semiconductor die and the plurality of other singulated semiconductor die from the die tray station to a scanning acoustic microscope where the scanning acoustic microscopy is performed.

17. The tool assembly of claim 14, further comprising:
a drying station enclosed in the second inner chamber;
wherein the evaluation unit is enclosed in the first inner chamber, wherein the first inner chamber is operably coupled to the second inner chamber via a transfer port extending between a sidewall of the first inner chamber and a sidewall of the second inner chamber.

18. The tool assembly of claim 17, wherein the drying station comprises:
a transfer track configured to slideably transfer a die tray, which retains the singulated semiconductor die, from a loading position on the transfer track to a drying position on the transfer track; and
a wind knife disposed over the transfer track and configured to blow the liquid off an upper surface of the singulated semiconductor die when the singulated semiconductor die is retained within the die tray.

19. The tool assembly of claim 14, wherein the die wipe station comprises:
a plate having a central plate region and a peripheral plate region, wherein outer sidewalls extend upwardly from the peripheral plate region such that an upper surface of the central plate region is recessed relative to upper regions of the outer sidewalls; and
an absorptive drying structure arranged on the central plate region and laterally confined by the outer sidewalls.

20. The tool assembly of claim 19, wherein the die wipe station further comprises:
a support structure having a substantially planar surface configured to receive a die tray and a plurality of legs supporting the substantially planar surface; and
wherein an outer edge of the peripheral plate region meets an outer edge of the substantially planar surface.

* * * * *